United States Patent
Huang et al.

(10) Patent No.: US 12,453,061 B2
(45) Date of Patent: Oct. 21, 2025

(54) SANDWICH STRUCTURE POWER MODULE

(71) Applicant: Monolithic Power Systems, Inc., Kirkland, WA (US)

(72) Inventors: Daocheng Huang, Kirkland, WA (US); Xu Han, Kirkland, WA (US); Zhe Yang, Kirkland, WA (US)

(73) Assignee: Monolithic Power Systems, Inc., Kirkland, WA (US)

( * ) Notice: Subject to any disclaimer, the term of this patent is extended or adjusted under 35 U.S.C. 154(b) by 388 days.

(21) Appl. No.: 18/090,734

(22) Filed: Dec. 29, 2022

(65) Prior Publication Data
US 2024/0224477 A1    Jul. 4, 2024

(51) Int. Cl.
  *H05K 7/20*   (2006.01)
  *H05K 1/14*   (2006.01)
  *H05K 1/18*   (2006.01)
  *H05K 7/02*   (2006.01)

(52) U.S. Cl.
  CPC .............. *H05K 7/209* (2013.01); *H05K 1/144* (2013.01); *H05K 1/145* (2013.01); *H05K 1/181* (2013.01); *H05K 7/023* (2013.01); *H05K 2201/042* (2013.01)

(58) Field of Classification Search
  CPC ........ H05K 7/209; H05K 7/023; H05K 1/144; H05K 1/145; H05K 1/181; H05K 2201/042
  USPC .......................................................... 361/716
  See application file for complete search history.

(56) References Cited

U.S. PATENT DOCUMENTS

| | | |
|---|---|---|
| 6,356,448 B1 | 3/2002 | DiBene et al. |
| 8,064,202 B2 | 11/2011 | Yin et al. |
| 8,604,597 B2 | 12/2013 | Jiang |
| 8,742,490 B2 | 6/2014 | Disney |
| 9,263,177 B1 | 2/2016 | Ikriannikov et al. |
| 11,317,546 B2 * | 4/2022 | Pradeepkumar ... H05K 7/20254 |
| 11,398,333 B2 | 7/2022 | Huang et al. |
| 11,682,515 B2 | 6/2023 | Huang et al. |
| 2005/0184372 A1 | 8/2005 | Asahi et al. |
| 2010/0176909 A1 | 7/2010 | Yasuda et al. |
| 2012/0056703 A1 | 3/2012 | Ikriannikov |

(Continued)

FOREIGN PATENT DOCUMENTS

WO    WO-2023220679 A1 *    11/2023 ............. H01L 24/09

OTHER PUBLICATIONS

U.S. Appl. No. 17/197,394, filed Sep. 15, 2022, Monolithic Power Systems, Inc.

*Primary Examiner* — Zhengfu J Feng
(74) *Attorney, Agent, or Firm* — Perkins Coie LLP

(57) ABSTRACT

A power module includes a first power module and a second power module arranged below the first power module. The first power module includes at least one input pad configured to receive an input voltage and at least one power pad configured to provide an intermediate voltage. The at least one input pad is mounted on a top surface of the first power module, and the at least one power pad is mounted on a bottom surface of the first power module. The second power module includes at least one signal pad configured to receive the intermediate voltage and at least one output pad configured to provide an output voltage. The at least one signal pad is mounted on a top surface of the second power module, and the at least one output pad is mounted on a bottom surface of the second power module.

17 Claims, 10 Drawing Sheets

(56) References Cited

U.S. PATENT DOCUMENTS

| | | |
|---|---|---|
| 2012/0193772 A1 | 8/2012 | Jiang |
| 2018/0063972 A1* | 3/2018 | Yang .................. H05K 7/20927 |
| 2018/0330870 A1* | 11/2018 | Sakai ..................... H05K 1/185 |
| 2020/0113058 A1* | 4/2020 | Xiong .................... H05K 1/186 |
| 2020/0312766 A1 | 10/2020 | Bhagavat et al. |
| 2020/0396855 A1 | 12/2020 | Ye et al. |
| 2022/0254563 A1* | 8/2022 | Yan ....................... H01F 27/292 |
| 2022/0295635 A1 | 9/2022 | Huang et al. |
| 2022/0295638 A1 | 9/2022 | Huang et al. |
| 2022/0295639 A1 | 9/2022 | Huang et al. |
| 2022/0369464 A1 | 11/2022 | Huang et al. |
| 2023/0269877 A1 | 8/2023 | Huang et al. |
| 2023/0396158 A1 | 12/2023 | Huang et al. |

* cited by examiner

SANDWICH STRUCTURE POWER MODULE

TECHNICAL FIELD

The present disclosure relates generally to electronic circuits, and more particularly but not exclusively to power modules.

BACKGROUND OF THE INVENTION

Power converter, as known in the art, converts an input power to an output power for providing a load with required voltage and current. They are widely used in high current and low voltage applications, such as server, microprocessor. With the development of modern GPUs (Graphics Processing Units), and CPUs (Central Processing Units), increasingly high load current is required to achieve better processor performance. However, higher current and smaller size put more challenges to the heat conduction. Therefore, it is desirable to provide a power module with high-power density, high-efficiency and excellent heat dissipation capability in space-constrained environments.

SUMMARY OF THE INVENTION

According to an embodiment of the present disclosure, a power module is provided. The power module includes a first power module and a second power module arranged below the first power module. The first power module includes at least one input pad configured to receive an input voltage and at least one power pad configured to provide an intermediate voltage. The at least one input pad is mounted on a top surface of the first power module, and the at least one power pad is mounted on a bottom surface of the first power module. The second power module includes at least one signal pad configured to receive the intermediate voltage and at least one output pad configured to provide an output voltage. The at least one signal pad is mounted on a top surface of the second power module, and the at least one output pad is mounted on a bottom surface of the second power module.

According to an embodiment of the present disclosure, a power module is provided. The power module includes a first PCB, a second PCB arranged below the first PCB, and a converter circuit. The first PCB has a top surface and a bottom surface, and at least one input pad configured to receive an input voltage is mounted on the top surface of the first PCB. The second PCB has a top surface and a bottom surface, and at least one power pad configured to provide an intermediate voltage is mounted on the bottom surface of the second PCB. The converter circuit includes at least one IC and a plurality of electronic components. The at least one IC and the electronic components are arranged between the bottom surface of the first PCB and the top surface of the second PCB.

BRIEF DESCRIPTION OF THE DRAWINGS

The present disclosure can be further understood with reference to following detailed description and appended drawings, wherein like elements are provided with like reference numerals. These drawings are only for illustration purpose, thus may only show part of the devices and are not necessarily drawn to scale.

DETAILED DESCRIPTION

Various embodiments of the present disclosure will now be described. In the following description, some specific details, such as example circuits and example values for these circuit components, are included to provide a thorough understanding of embodiments. One skilled in the relevant art will recognize, however, that the present disclosure can be practiced without one or more specific details, or with other methods, components, materials, etc. In other instances, well-known structures, materials, processes or operations are not shown or described in detail to avoid obscuring aspects of the present disclosure.

Throughout the specification and claims, the terms "left", "right", "in", "out", "front", "back", "up", "down", "top", "atop", "bottom", "on", "over", "under", "above", "below", "vertical" and the like, if any, are used for descriptive purposes and not necessarily for describing permanent relative positions. It is to be understood that the terms so used are interchangeable under appropriate circumstances such that embodiments of the technology described herein are, for example, capable of operation in other orientations than those illustrated or otherwise described herein. The phrases "in one embodiment", "in some embodiments", "in one implementation", and "in some implementations" as used includes both combinations and sub-combinations of various features described herein as well as variations and modifications thereof. These phrases used herein does not necessarily refer to the same embodiment, although it may. Those skilled in the art should understand that the meanings of the terms identified above do not necessarily limit the terms, but merely provide illustrative examples for the terms. It is noted that when an element is "connected to" or "coupled to" the other element, it means that the element is directly connected to or coupled to the other element, or indirectly connected to or coupled to the other element via another element. Particular features, structures or characteristics may be included in an integrated circuit, an electronic circuit, a combinational logic circuit, or other suitable components that provide the described functionality. In addition, it is appreciated that the figures provided herewith are for explanation purposes to persons ordinarily skilled in the art and that the drawings are not necessarily drawn to scale.

Figure 1:
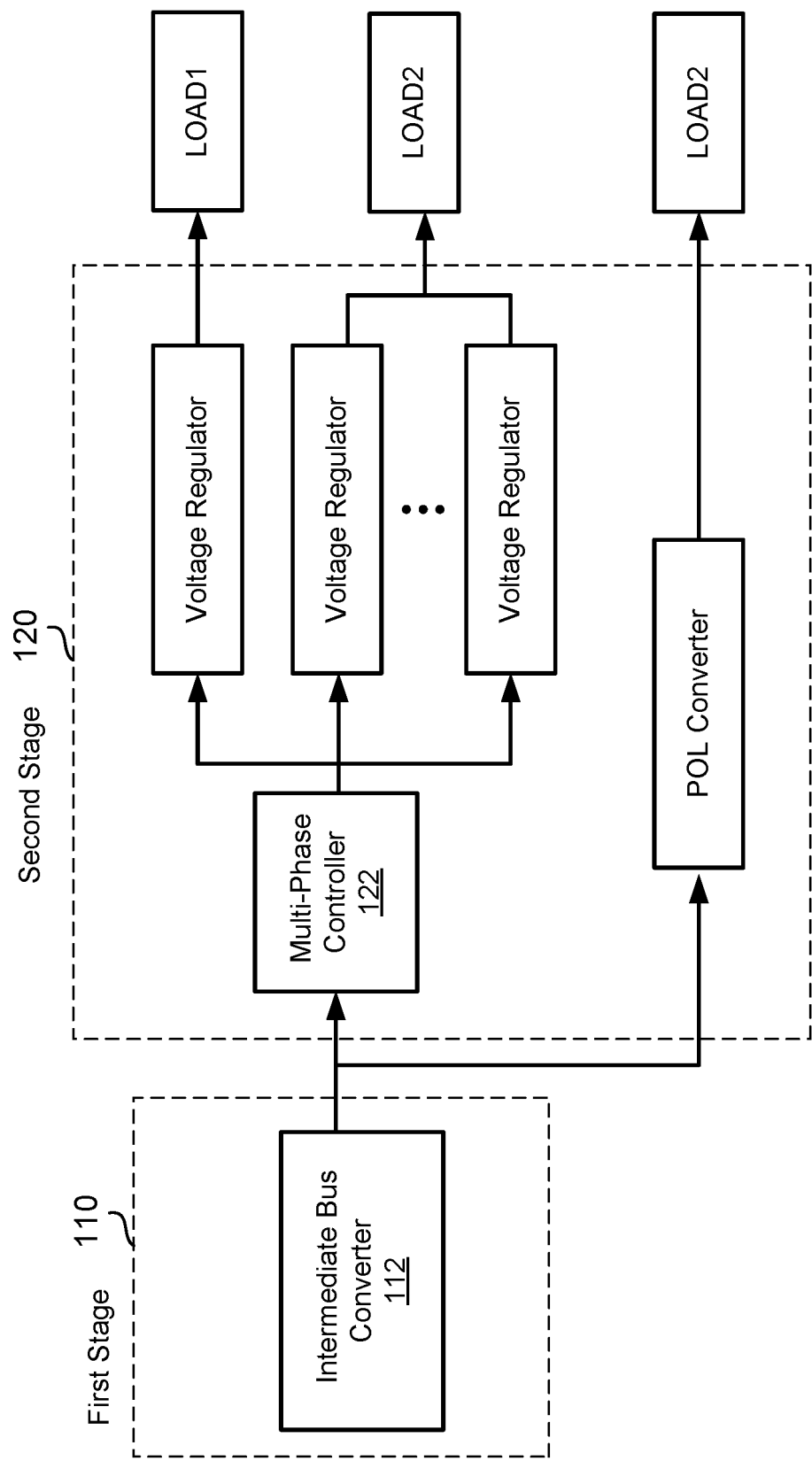
FIG. 1 is a schematic block diagram of a two-stage power supply architecture in accordance with an embodiment of the present disclosure.

FIG. 1 is a schematic block diagram of a two-stage power supply architecture 100 in accordance with an embodiment of the present disclosure. In this embodiment, a first stage 110 and a second stage 120 are applied to provide the power to the load. For instance, the first stage 110 includes an intermediate bus converter 112. The intermediate bus converter 112 is configured to receive an input voltage (e.g., 48V) and provide an intermediate voltage (e.g., 12V). In one embodiment, the intermediate bus converter 112 may use a LLC converter, a switched tank converter, a Hybrid switched-capacitor (HSC) converter, or other converter topology.

Depending on the power level of the load, the second stage 120 may utilize a low-dropout regulator (LDO), a buck converter, and/or a multi-phase voltage regulators. For instance, a multi-phase voltage regulator is configured to power the processor and memory that required higher current, while a point-of-load (POL) converter (e.g., a buck converter) or LDO is used to power the fan, and/or other peripheral devices.

In contrast to the one-stage converter, the input voltage of the two-stage converter is reduced, the need for low-duty ratios is also reduced. This reduces losses and improved the efficiency. In addition, the transistors and other electronic components do not need to withstand high voltage, and the cost of the devices could be saved. Furthermore, the sized of the devices could be smaller. Therefore, the proposed two-stage power distribution solution will improve efficiency, scalability, and cost compared to existing solutions.

Figure 2:
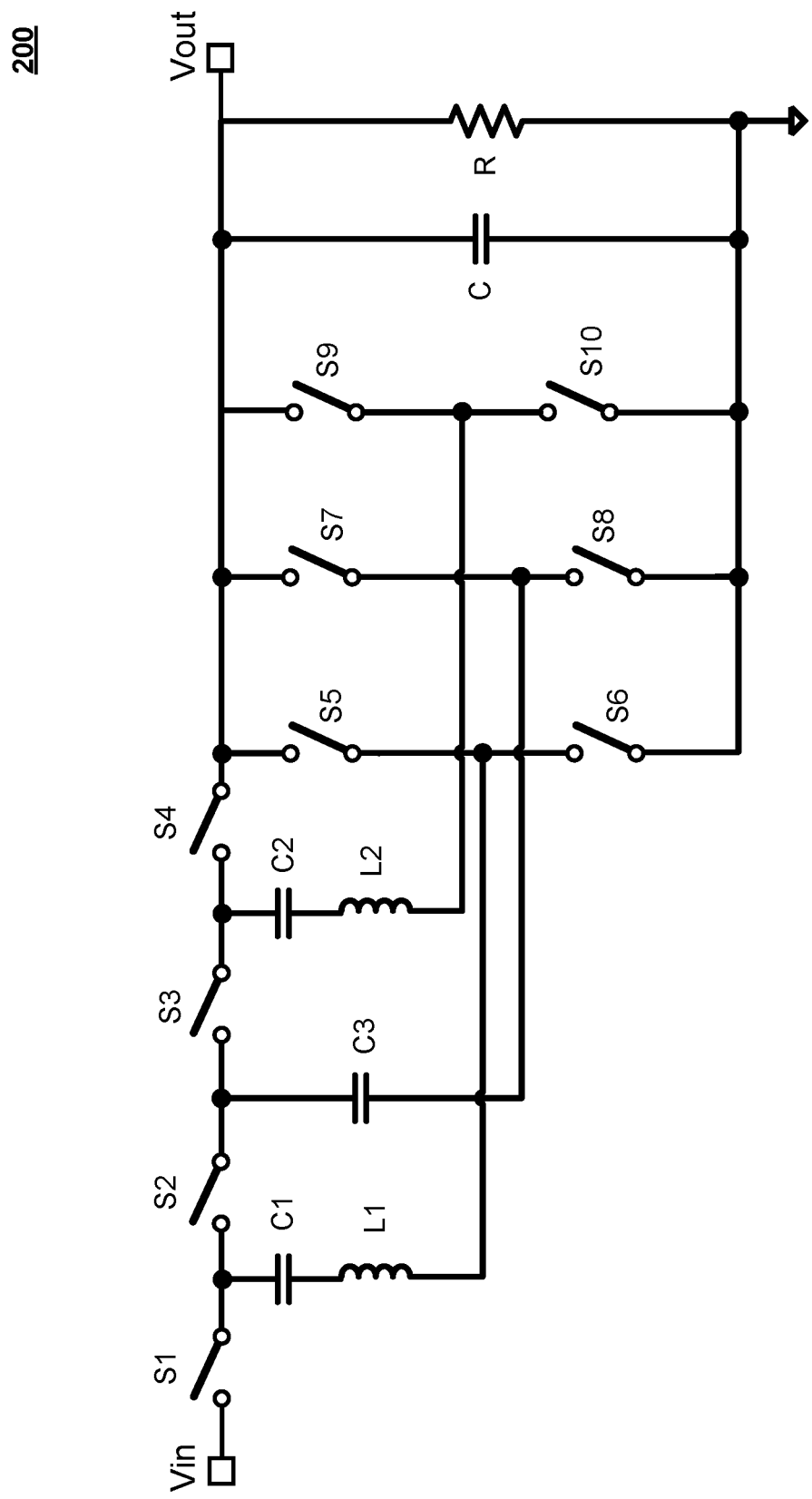
FIG. 2 is a schematic circuit diagram of a switched tank converter in accordance with an embodiment of the present disclosure.

In one embodiment, the intermediate bus converter 112 includes a switched tank converter (STC). FIG. 2 is a schematic circuit diagram of a switched tank converter 200 in accordance with an embodiment of the present disclosure. As shown in FIG. 2, the switched tank converter 200 includes a plurality of resonant tanks. Each resonant tank includes one resonant inductor (e.g., L1, L2) and one resonant capacitor (e.g., C1, C2). The switched tank converter 200 also includes at least one capacitor (e.g., C1, C3). The switched tank converter 200 further includes a plurality of switches S1, S2, S3, S4, S5, S6, S7, S8, S9 and S10, and an output capacitor C. The switched tank converter 200 receives an input voltage Vin from a power supply, and converts the input voltage Vin into an output voltage Vout to a load R.

Figure 3:
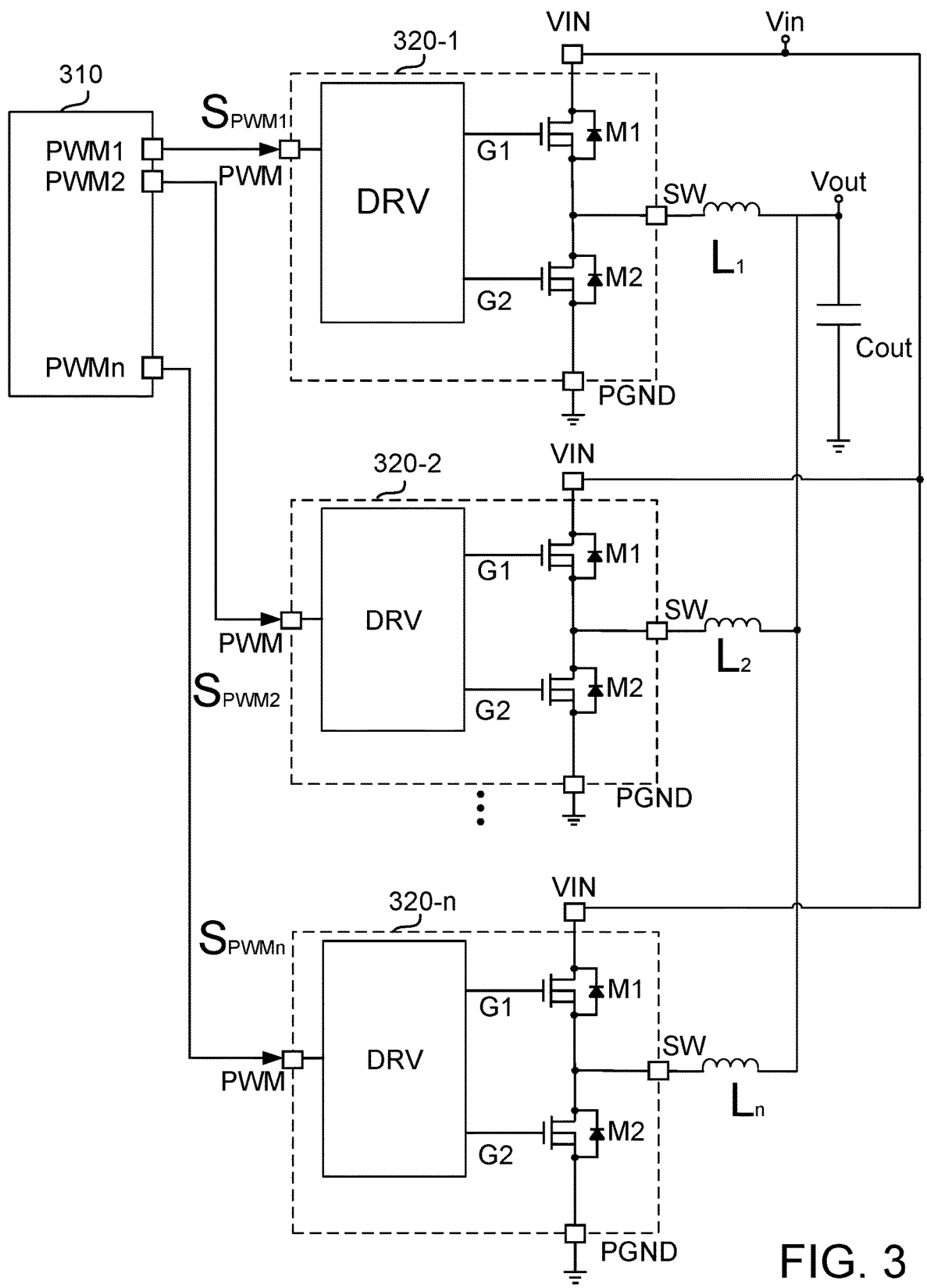
FIG. 3 is a schematic block diagram of a multi-phase voltage regulator in accordance with an embodiment of the present disclosure.

In one embodiment, the second stage includes a multi-phase voltage regulator. FIG. 3 is a schematic block diagram of a multi-phase voltage regulator 300 in accordance with an embodiment of the present disclosure. The multi-phase voltage regulator 300 includes a multi-phase controller 310, multiple power devices 320-1, 320-2, ..., 320-n, multiple inductors $L_1, L_2, ..., L_n$, and an output capacitor Cout, where n is a positive integer greater than 1. Each phase of the voltage regulator includes one power device and inductor. In this embodiment, the voltage regulator is a buck converter. As can be appreciated, the voltage regulator may also be configured as a boost converter or other type of power converter depending on the application. Each phase of the voltage regulator may be connected to provide a multiphase output voltage at the output node Vout. The output capacitor Cout is coupled to the output node Vout.

In one implementation, the multi-phase controller 310 is an integrated circuit (IC). The multi-phase controller 310 includes multiple pins (e.g., PWM1, PWM2, ..., PWMn) configured to provide N phase control signals (e.g., $S_{PWM1}$, $S_{PWM2}$, ..., $S_{PWMn}$) respectively to N power devices 320-1, 320-2, ..., 320-n.

Each power device includes a driving circuit DRV and two switches M1 and M2. The high-side switch M1 is connected to an input voltage VIN. The switches M1 and M2 are driven by a driving signal G1 and G2, respectively. In one implementation, each power device is a monolithic IC having a PWM pin configured to receive a pulse width modulation (PWM) control signal from the multi-phase controller 310, a VIN pin coupled to a voltage source Vin to receive an input voltage, a PGND pin coupled to a ground, and a SW pin coupled to the output node Vout via an inductor for providing the output voltage to a load.

In one implementation, multiple inductors $L_1, L_2, ..., L_n$ are integrated into an inductor module. The inductor module includes one or more magnetic core and windings. In one implementation, the output capacitor Cout is realized by multiple capacitors connected in parallel. In another implementation, the power devices ICs and the inductors are integrated into a power module. In some implementations, the multi-phase controller IC 310, the power devices ICs and the inductor module, the output capacitor are integrated into a power module.

Figure 4A:
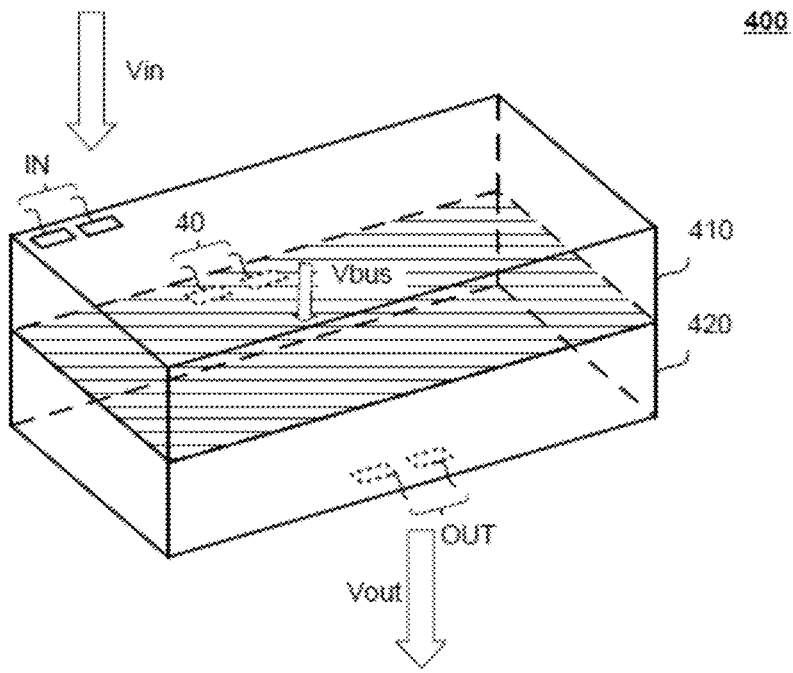
FIG. 4A is a schematic diagram of a power module in accordance with an embodiment of the present disclosure.

FIG. 4A is a schematic diagram of a power module 400 in accordance with an embodiment of the present disclosure. The power module 400 includes a first power module 410 and a second power module 420. As shown in FIG. 4A, at least one input pad IN is mounted on the top surface of the first power module 410 and configured to receive an input voltage Vin. The first power module 410 further includes at least one power pad 40 mounted on the bottom surface of the first power module 410, and the power pad 40 is configured to provide an intermediate voltage Vbus. The second power module 420 is arranged below the first power module 410. The second power module 420 is configured to receive the intermediate voltage Vbus and configured to provide an output voltage Vout. Specifically, at least one signal pad configured to receive the intermediate voltage is mounted on a top surface of the second power module 420, and at least one output pad OUT configured to provide the output voltage OUT is mounted on a bottom surface of the second power module 420.

As shown in FIG. 4A, the power module 400 provides vertical power delivery to a load through the top surface of the first power module 410 to the bottom of the second power module 420. In comparison with the conventional design that all devices are mounted on the plane of one PCB, the size of each PCB of the present disclosure is smaller since it is stacked vertically. Moreover, since the distance the current flow through the 3D stacking structure is shorter, the power delivery network impedance is reduced. In other words, the power delivery network losses is reduced. Furthermore, the connection losses (e.g., intermediate bus losses) is reduced and thus improves the power density and efficiency.

Figure 4B:
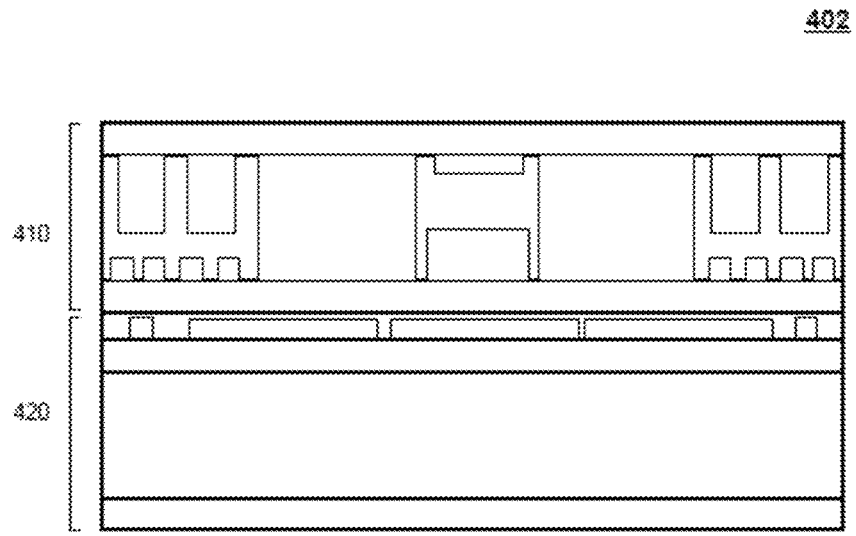
FIG. 4B is a schematic diagram of a power module in accordance with an embodiment of the present disclosure.

FIG. 4B is a schematic diagram of a side view of a power module 402 in accordance with an embodiment of the present disclosure. As shown in FIG. 4B, the first power module 410 is arranged on top of the second power module 420. As can been seen, the ICs and electronic components are arranged between the top surface of the first power module 410 to the bottom of the second power module 420. Thus, the power module 402 provides a flat top surface and a flat bottom surface. In this case, it is easy to connect to other devices, such as the power supply or the load for transmitting and receiving signals and power delivery.

Figure 5:
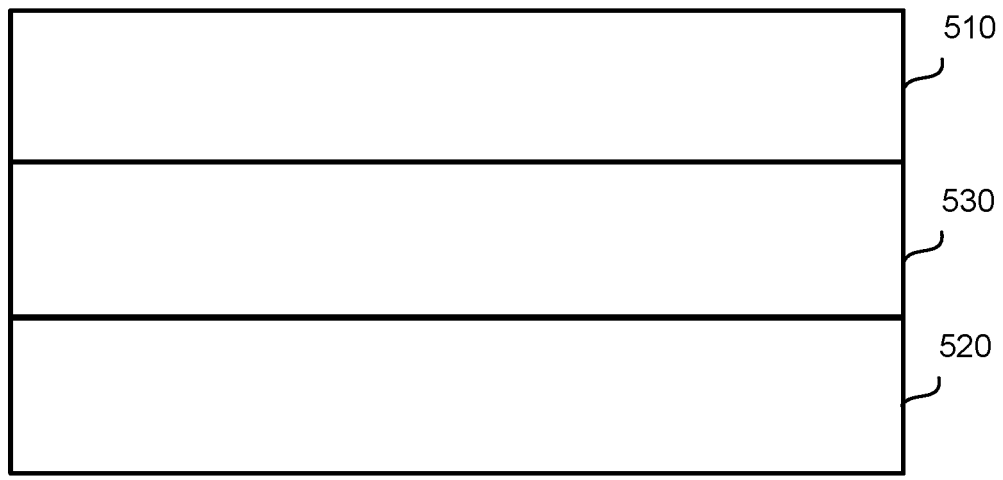
FIG. 5 is a schematic diagram of a side view of a power module in accordance with an embodiment of the present disclosure.

In one embodiment, the power module further includes a heat spreader. FIG. 5 is a schematic diagram of a side view of a power module 500 in accordance with an embodiment of the present disclosure. As shown in FIG. 5, a heat spreader 530 is arranged between the first power module 510 and the second power module 520. For example, the heat spreader includes a heat sink or a heat exchanger. The heat sink may be a block made by high thermal conductivity material, such as copper. In another example, the heat spreader includes a fan to provide air flow. The heat spreader may also be a heat pipe radiator. The heat pipe radiator includes a container and pipes filled with working fluid.

Figure 6A:
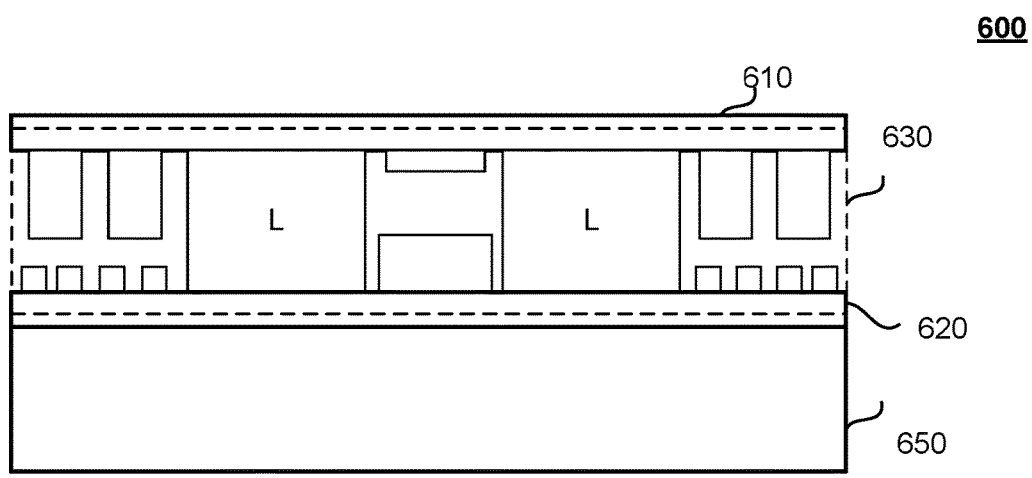
FIG. 6A is a schematic diagram of a side view of a first power module in accordance with an embodiment of the present disclosure.

In one embodiment, the first power module includes a switched tank converter. FIG. 6A is a schematic diagram of a side view of a first power module 600 in accordance with an embodiment of the present disclosure. As shown in FIG. 6A, the first power module 600 includes a first printed circuit board (PCB) 610, a second PCB 620 arranged below the first PCB, and a switched tank converter circuit 630. The switched tank converter circuit 630, including at least one integrated circuit (IC) and a plurality of electronic components, is arranged between the bottom surface of the first PCB 610 and the top surface of the second PCB 620. The switched tank converter further includes resistors, inductors, capacitors, transistors, and/or other electronic components. The switched tank converter 630 is configured to receive an input voltage via at least one input pad mounted on the top surface of the first PCB 610, and configured to provide an intermediate voltage via at least one signal pad mounted on the bottom surface of the second PCB 620.

In one implementation, the inductors L are the tallest components in the power module 600, and thus determine the height of the first power module (i.e., from the top surface of the first PCB 610 to the bottom surface of the second PCB 620). The height of the power module 600 is approximately 3.4 mm.

In this embodiment, the first power module 600 further includes a heat spreader 550 arranged below the second PCB 630. Since the STC structure utilizes inductors instead of a transformer, the inductors L could be arranged between the bottom surface of the first PCB 610 and the top surface of the second PCB 620, and thus provide a flat top surface and bottom surface of the first power module 600 (i.e., STC). As such, the flat surface is beneficial for the heatsink design and thermal management and provides reliable input and output interface. The STC structure also achieves a low profile.

Figure 6B:
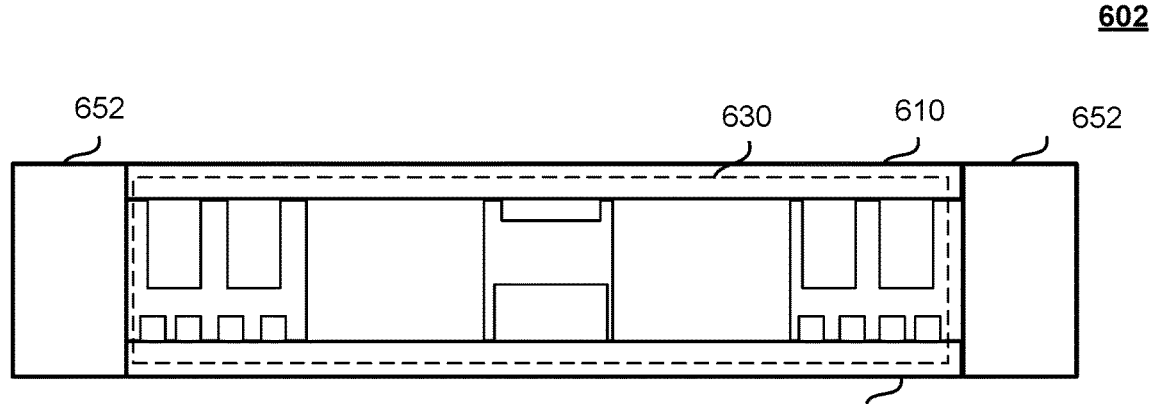
FIG. 6B is a schematic diagram of a side view of a first power module in accordance with another embodiment of the present disclosure.
Figure 6C:
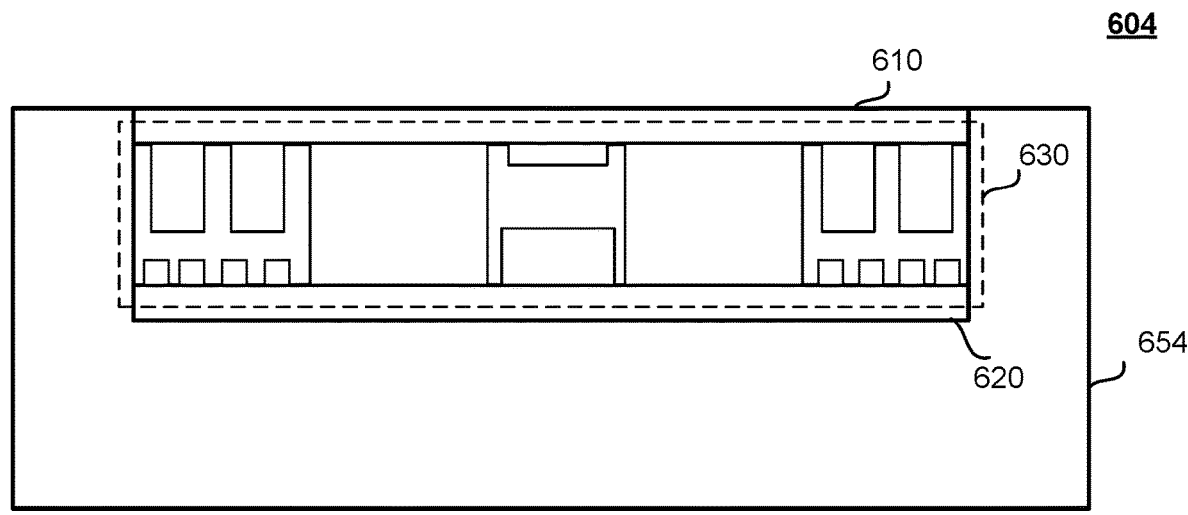
FIG. 6C is a schematic diagram of a side view of a first power module in accordance with yet another embodiment of the present disclosure.

FIG. 6B is a schematic diagram of a side view of a first power module 602 in accordance with another embodiment of the present disclosure. As shown in FIG. 6B, the power module is surrounded by the heat spreader 652. FIG. 6C is a schematic diagram of a side view of a first power module 604 in accordance with yet another embodiment of the present disclosure. As shown in FIG. 6C, the power module is embedded in the heat spreader 654.

Figure 7:
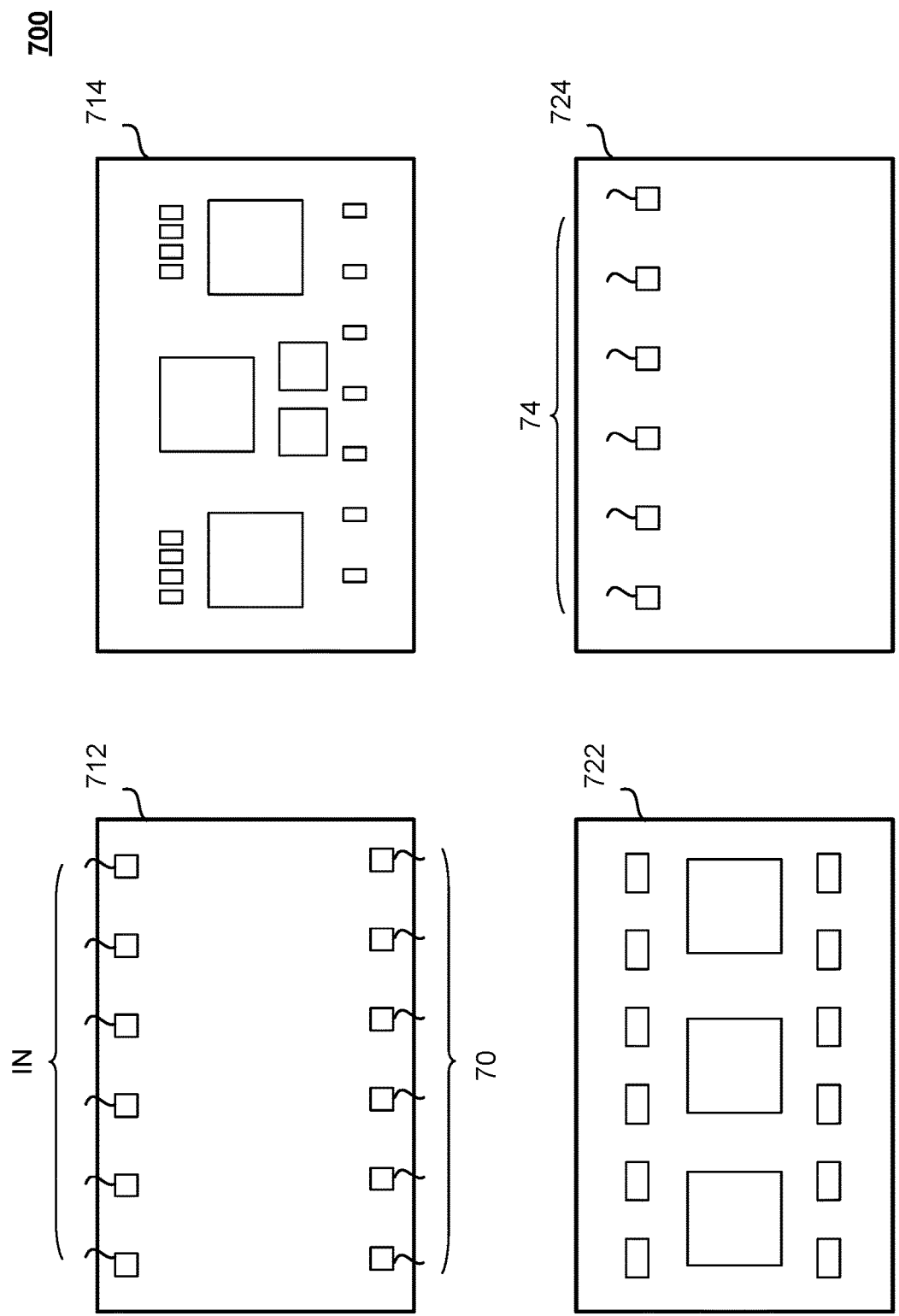
FIG. 7 is a schematic diagram of a plan view a power module in accordance with an embodiment of the present disclosure.

FIG. 7 is a schematic diagram of a plan view a power module 700 in accordance with an embodiment of the present disclosure. The power module 700 includes a first PCB and a second PCB arranged below the first PCB, and a converter circuit disposed on the first PCB and second PCB. As shown in FIG. 7, 712 is a top view of a first PCB, 722 is a bottom view of the first PCB, 722 is a top view of a second PCB, and 724 is a bottom view of the second PCB. In one embodiment, the converter circuit is a switched tank converter. In one implementation, multiple input pads IN configured to receive an input voltage Vin are mounted on the top surface 712 of first PCB. In some implementations, one or more pads 70 are mounted on the top surface 712 of first PCB configured to receive or transmit monitor signals, enable signals, control signals and/or ground signals. The switched tank converter circuit, including at least one IC and a multiple electronic components, is arranged on the bottom surface 714 of the first PCB and the top surface 722 of the second PCB. The at least one IC has multiple pins coupled to the one or more pads for receiving and transmitting signals. For instance, a STC controller IC, a transistor ICs, a gate driver IC, a rectifier IC, and/or buck converter IC and one or more resistors, inductors, capacitors, transistors, and/or other electronic components are disposed on bottom surface 714 of the first PCB or the top surface 722 of the second PCB. Multiple power pads 74 configured to provide an intermediate voltage Vbus are mounted on the bottom surface 724 of the second PCB. It should be noted that the location, size and shape of the pads, ICs, and the electronic components shown in FIG. 7 is only for illustration purpose. The specific layout of the pads, ICs and electronic components on the two PCBs may be designed according to practical applications.

In one implementation, the length of the first and second PCBs of the first power module is approximately 24 mm and the width of the first and second PCBs is approximately 16.7 mm.

Figure 8:
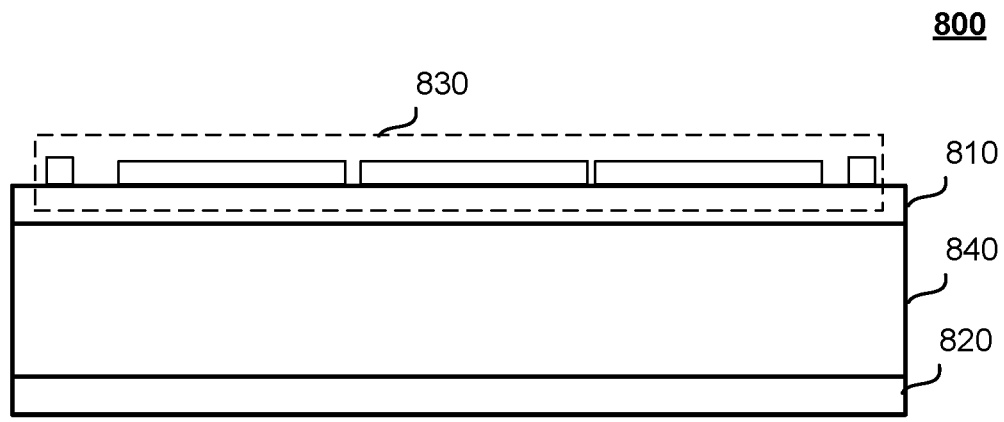
FIG. 8 is a schematic diagram of a side view of a second power module in accordance with an embodiment of the present disclosure.

FIG. 8 is a schematic diagram of a side view of a second power module 800 in accordance with an embodiment of the present disclosure. As shown in FIG. 8, the second power module 800 includes a first PCB 810, a second PCB 820, a power circuit 830 and an inductor module 840. The inductor module 840 is arranged between the first PCB 810, and the second PCB. Specifically, a power circuit including at least one IC and a plurality of electronic components is mounted on the top surface of the first PCB 810.

In one embodiment, the second power module includes a multi-phase voltage regulator. For instance, a multi-phase controller IC and multiple power devices having a driving circuit and two switches are mounted on the top surface of the first PCB 810. The inductor module is coupled between the multiple power devices and the output pad mounted on the bottom surface of the second PCB 820. The inductor module includes multiple output inductors, each output inductor is coupled between the corresponding power device and the corresponding output capacitor. The output capacitors are arranged below the inductor module 840. In one implementation, the output capacitors are mounted on top surface of the second PCB 820.

Figure 9:
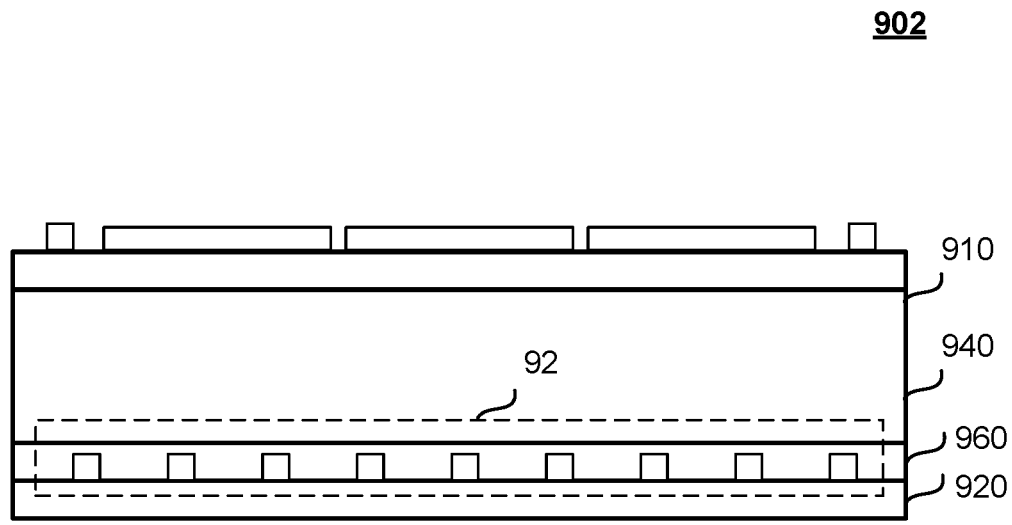
FIG. 9 is a schematic diagram of a side view of a second power module in accordance with another embodiment of the present disclosure.

In another implementation, the output capacitors are embedded in a substrate layer. FIG. 9 is a schematic diagram of a side view of a second power module 902 in accordance with another embodiment of the present disclosure. As shown in FIG. 9, multiple capacitors 92 is embedded in a substrate layer 960 arranged between the inductor module 940 and the second PCB 920.

In some embodiments, the second PCB 920 is not required. Instead, the inductor module 840/940 and/or the substrate layer 960 may be disposed on a system board of the load. Therefore, the output pads configured to provide an output voltage is disposed on the bottom surface of the inductor module 840/940 or disposed on the bottom surface of the substrate layer 960.

Figure 10:
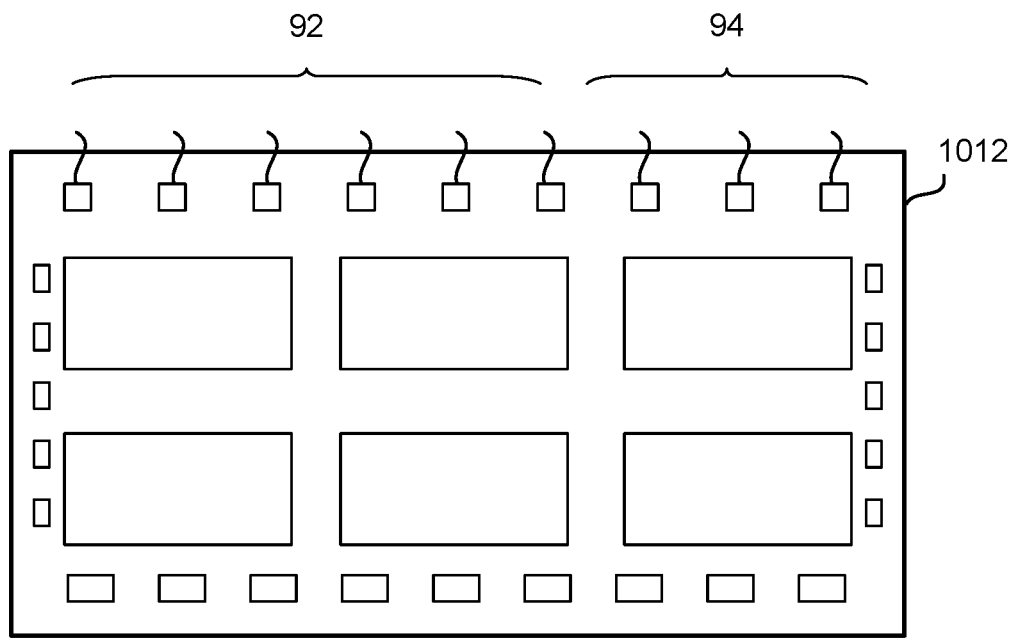
FIG. 10 is a schematic diagram of a plan view a first PCB of a second power module in accordance with an embodiment of the present disclosure.
Figure 10:
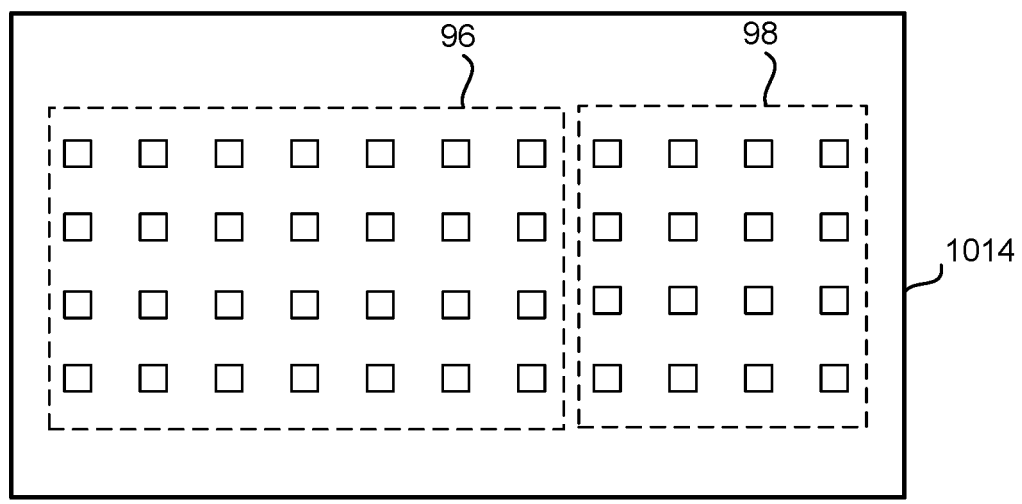

FIG. 10 is a schematic diagram of a plan view a first PCB 910 of a second power module in accordance with an embodiment of the present disclosure. As shown in FIG. 10, 1012 is a top view of a first PCB 910, and 1012 is a bottom view of the first PCB 910. In one embodiment, the converter circuit is a multi-phase voltage regulator. In one implementation, at least one multiple signal pads 92 configured to receive an intermediate voltage Vbus are mounted on the top surface 1012 of first PCB. In some implementations, one or more pads 94 are mounted on the top surface 1012 of first PCB configured to receive or transmit monitor signals, enable signals, control signals and/or ground signals. A multi-phase controller IC, multiple power ICs and multiple electronic components are arranged on the top surface 1012 of the first PCB. Multiple pads 96 are mounted on the bottom surface 1014 of the first PCB and are configured to provide an output voltage Vout. In some implementations, one or more pads 98 configured to receive or transmit monitor signals, enable signals, control signals and/or ground signals. It should be noted that the location, size and shape of the pads, ICs, and the electronic components shown in FIG. 10 is only for illustration purpose. The specific layout of the pads, ICs and electronic components on the two PCBs may be designed according to practical applications.

In one implementation, the length of the first PCB 910 of the second power module is approximately 29.6 mm and the width of the first and second PCBs is approximately 16.7 mm. The height of the inductor module is approximately 2.3 mm.

Figure 11A:
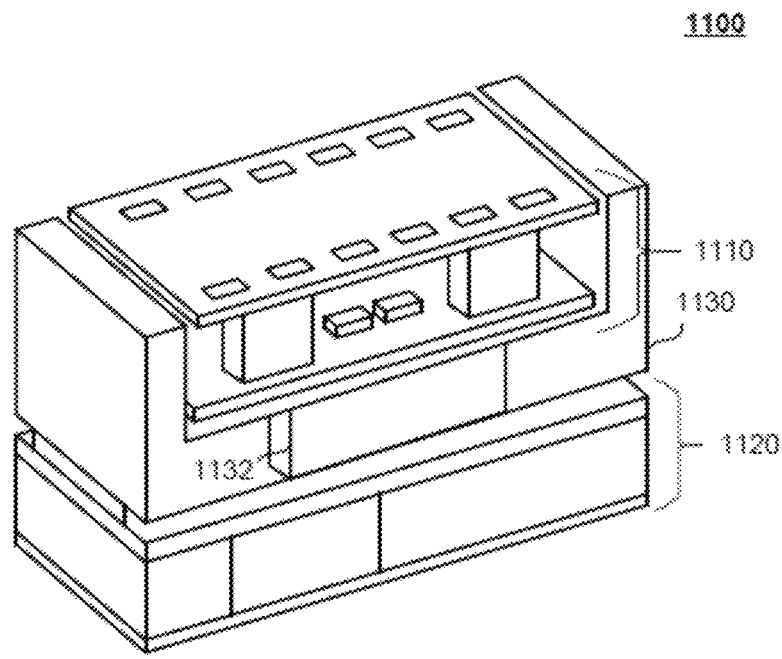
FIG. 11A is a schematic diagram of a power module in accordance with an embodiment of the present disclosure.
Figure 11B:
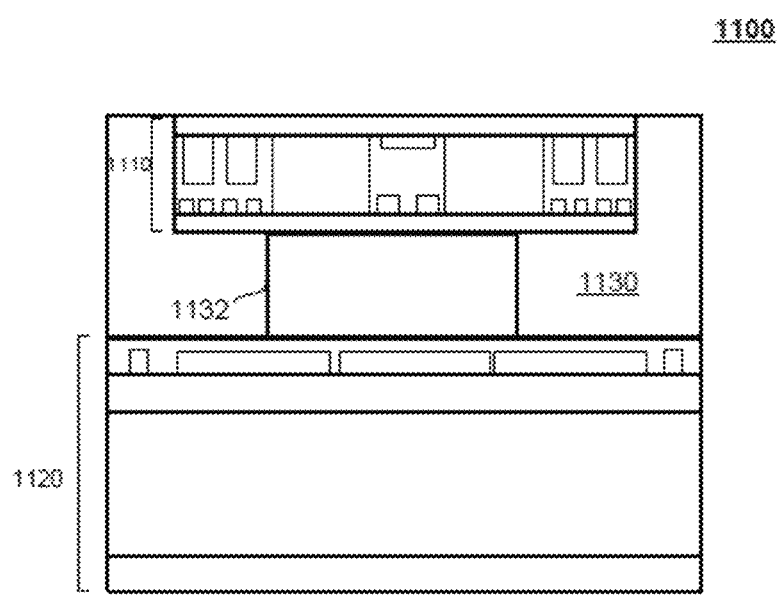
FIG. 11B is a schematic diagram of a side view of a power module in accordance with an embodiment of the present disclosure.

FIG. 11A is a schematic diagram of a power module 1100 in accordance with an embodiment of the present disclosure. FIG. 11B is a schematic diagram of a side view of a power module 1100 in accordance with an embodiment of the present disclosure. As shown in FIGS. 11A and 11B, the power module 1100 is a sandwich structure. The first power module 1110 is arranged on top of the second power module 1120. The power module 1100 further includes a heat spreader 1130 arranged between the first power module 1110 and the second power module 1120. In one embodiment, the first power module 1110 is embedded in the heat spreader 1130.

In one embodiment, the power module further includes a connector 1132, connected between the first power module 1110 and the second power module 1120, configured to receive and transmit signals. As shown in FIGS. 11A and 11B, the connector 1132 is disposed adjacent to or surrounded by the heat spreader 1130. It is well understood that there may be one or more connectors connected between different layers of PCBs to provide a vertical electrical connection. For instance, the connector may include signal pins made by metal pillars connecting to solder pads on the PCB. The connector may further be realized by metal lines, metal plates, metal contacts, vias and any electrically conductive connectors.

In one implementation, the length of the two-stage power module 1100 is approximately 29.6 mm, the width of the two-stage power module 1100 is approximately 16.7 mm, and the height of the two-stage power module 1100 is approximately 15 mm.

Based on the above, the present disclosure provides a power module achieves vertical power delivery such that the current travels from top to down through each layer of PCBs. The size of each PCB of the present disclosure is smaller since it is stacked vertically. Moreover, since the distance the current flow through the 3D stacking structure is shorter, the power delivery network impedance is reduced. Furthermore, the connection losses (e.g., intermediate bus losses) is reduced and thus improves the power density and efficiency. The flat surface is beneficial for the heatsink design and thermal management and provides reliable input and output interface. The sandwich structure also achieves a low profile.

It will be appreciated by persons skilled in the art that the present disclosure is not limited to what has been particularly shown and described herein above. Rather the scope of the present disclosure is defined by the claims and includes both combinations and sub-combinations of the various features described hereinabove as well as variations and modifications thereof which would occur to persons skilled in the art upon reading the foregoing description and which are not in the prior art.

What is claimed is:

1. A power module, comprising:
   a first power module including at least one input pad configured to receive an input voltage and at least one power pad configured to provide an intermediate voltage, wherein the at least one input pad is mounted on a top surface of the first power module, and the at least one power pad is mounted on a bottom surface of the first power module; and
   a second power module arranged below the first power module, wherein the second power module includes at least one signal pad configured to receive the intermediate voltage and at least one output pad configured to provide an output voltage, the at least one signal pad is mounted on a top surface of the second power module, and the at least one output pad is mounted on a bottom surface of the second power module.

2. The power module of claim 1, wherein the first power module further comprises:
   a first printed circuit board (PCB) having a top surface and a bottom surface, wherein the at least one input pad is mounted on the top surface of the first PCB;
   a second PCB arranged below the first PCB, wherein the second PCB has a top surface and a bottom surface, and the at least one power pad is mounted on the bottom surface of the second PCB;
   at least one integrated circuit (IC) and a plurality of electronic components arranged between the bottom surface of the first PCB and the top surface of the second PCB.

3. The power module of claim 1, wherein the second power module further comprises:
   a third PCB having a top surface and a bottom surface, wherein the at least one signal pad is mounted on the top surface of the third PCB;
   at least one IC and a plurality of electronic components mounted on the top surface of the third PCB; and
   an inductor module arranged below the bottom surface of the third PCB.

4. The power module of claim 1, further comprising:
   a heat spreader arranged between the first power module and the second power module.

5. The power module of claim 1, further comprising:
a heat spreader, wherein the first power module is embedded in the heat spreader.

6. The power module of claim 1, further comprising:
a connector, connected between the first power module and the second power module, configured to receive or transmit signals.

7. The power module of claim 1, wherein the first power module includes a switched tank converter.

8. The power module of claim 1, wherein the first power module includes a LLC converter.

9. The power module of claim 1, wherein the second power module includes a buck converter.

10. The power module of claim 3, wherein the second power module includes a multi-phase voltage regulator, and the second power module further comprises:
a multi-phase controller IC mounted on the top surface of the third PCB; and
a plurality of power devices coupled to the multi-phase controller IC, wherein the power devices are mounted on the top surface of the third PCB, and each power device has two switches and a driver circuit configured to provide control signals to the two switches;
a plurality of output capacitors arranged below the inductor module;
wherein the inductor module includes a plurality of output inductors, each output inductor is coupled between a corresponding power device of the power devices and a corresponding output capacitor of the output capacitors.

11. The power module of claim 10, wherein the output capacitors are embedded in a substrate layer PCB arranged below the inductor module.

12. A power module, comprising:
a first PCB having a top surface and a bottom surface, wherein at least one input pad configured to receive an input voltage is mounted on the top surface of the first PCB;
a second PCB arranged below the first PCB, wherein the second PCB has a top surface and a bottom surface, wherein at least one power pad configured to provide an intermediate voltage is mounted on the bottom surface of the second PCB; and
a converter circuit including at least one IC and a plurality of electronic components, wherein the at least one IC and the electronic components are arranged between the bottom surface of the first PCB and the top surface of the second PCB.

13. The power module of claim 12, further comprising:
a heat spreader, wherein the first PCB and the second PCB is embedded in the heat spreader.

14. The power module of claim 12, further comprising:
a heat spreader arranged below the bottom surface of the second PCB.

15. The power module of claim 12, further comprising:
a heat spreader, wherein the first PCB and the second PCB is surrounded by the heat spreader.

16. The power module of claim 12, wherein the converter circuit includes a switched tank converter.

17. The power module of claim 12, wherein the converter circuit includes a LLC converter.

* * * * *